(12) United States Patent
Parkinson et al.

(10) Patent No.: US 8,120,943 B2
(45) Date of Patent: *Feb. 21, 2012

(54) ACCESSING A PHASE CHANGE MEMORY

(75) Inventors: Ward Parkinson, Boise, ID (US); Tyler Lowrey, Rochester Hills, MI (US)

(73) Assignee: Ovonyx, Inc., Troy, MI (US)

( * ) Notice: Subject to any disclaimer, the term of this patent is extended or adjusted under 35 U.S.C. 154(b) by 62 days.

This patent is subject to a terminal disclaimer.

(21) Appl. No.: 12/574,005

(22) Filed: Oct. 6, 2009

(65) Prior Publication Data

US 2010/0020595 A1    Jan. 28, 2010

Related U.S. Application Data

(63) Continuation of application No. 11/983,098, filed on Nov. 7, 2007, now Pat. No. 7,778,064.

(51) Int. Cl.
*G11C 11/00* (2006.01)

(52) U.S. Cl. .................... 365/148; 365/189.02; 365/204

(58) Field of Classification Search .................. 365/148, 365/198.02, 204, 189.02
See application file for complete search history.

(56) References Cited

U.S. PATENT DOCUMENTS

| | | | |
|---|---|---|---|
| 7,778,064 B2 * | 8/2010 | Parkinson et al. | 365/148 |
| 2006/0181915 A1 * | 8/2006 | Oh et al. | 365/148 |
| 2006/0181945 A1 * | 8/2006 | Murayama et al. | 365/205 |
| 2008/0062739 A1 * | 3/2008 | Bill et al. | 365/148 |

* cited by examiner

*Primary Examiner* — Hoai V Ho
(74) *Attorney, Agent, or Firm* — Kevin L. Bray

(57) ABSTRACT

A memory employs a low-level current source to access a phase change memory cell. The current source charges an access capacitor in order to store sufficient charge for an ensuing access. When a memory cell is accessed, charge stored on the capacitor is discharged through the phase change memory, supplying a current to the phase change memory cell that is sufficient for the intended access operation and greater than that provided directly by the current source.

18 Claims, 5 Drawing Sheets

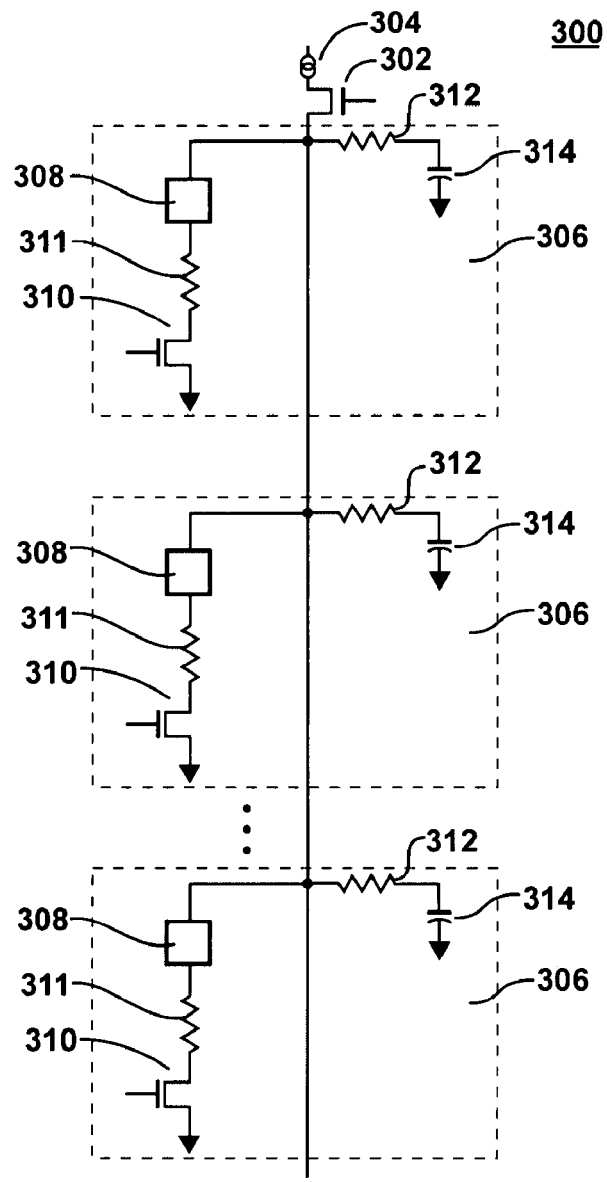
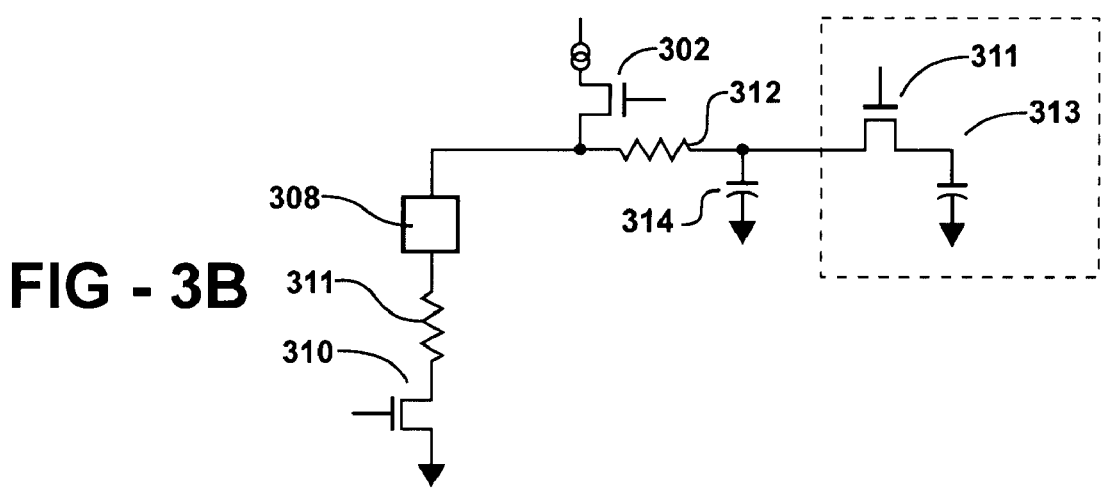
FIG - 3A
FIG - 3B

ACCESSING A PHASE CHANGE MEMORY

CROSS-REFERENCE TO RELATED APPLICATIONS

This application is a continuation of U.S. patent application Ser. No. 11/983,098, entitled "Accessing a Phase Change Memory", and filed on Nov. 7, 2007, now U.S. Pat. No. 7,778,064, the disclosure of which is incorporated by reference herein.

FIELD OF INVENTION

This invention pertains to accessing phase change memories. More particularly, this invention relates to providing access current to a phase change memory device.

BACKGROUND OF THE INVENTION

Phase-change memory arrays are based upon memory elements that switch among two material phases, or gradations thereof, to exhibit corresponding distinct electrical characteristics. Alloys of elements of group VI of the periodic table, such as Te or Se, referred to as chalcogenides or chalcogenic materials, can be used advantageously in phase change memory cells. In the chalcogenides, the resistivity varies by two or more orders of magnitude when the material passes from the amorphous (more resistive) phase to the crystalline (more conductive) phase, and vice versa. In the amorphous state, moreover, the resistivity depends to a marked extent upon the temperature, with variations of approximately one order of magnitude every 100° C.

A chalcogenide memory device may utilize the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are relatively stable. Above 200° C. and at temperatures less than those necessary for reset, there is an increase in nucleation of the crystallites and, if the material is kept at the crystallization temperature for a sufficiently long time, it undergoes a phase change and becomes crystalline. This crystalline state is then retained whether the material is cooled rapidly or slowly. To bring the chalcogenide back to the amorphous state it is necessary to raise the temperature above the melting temperature (approximately 600° C.) and then cool it off rapidly. If instead, the material is cooled slowly, increased degrees of crystallization result after cooling. From the electrical standpoint, it is possible to reach the crystallization and melting temperatures by causing a current to flow through a crystalline resistive element that heats the calcogenic material by the Joule effect.

Each memory state of a chalcogenide memory material corresponds to a distinct resistance value and each memory resistance value signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material and rate of cooling after heating, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance at currents significantly less than those necessary for programming; e.g. less than half the current necessary to crystallize the material. Programming among the different states is reversible and the memory devices can be written and read over a large number of cycles with robust and reliable operation until one of the states deteriorates, signaling the endurance limit has been reached for that bit. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in *Science News*, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process: a chalcogenide nitride, or oxide, for example and chalcogenide may be modified by an ion implantation or other process.

Early work in chalcogenide devices demonstrated electrical switching behavior in which switching from a resistive state to a conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching for over 10 cycles. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

In order to limit the power consumption of phase change memories and, in part, to thereby ensure that phase change memories are fully compatible with existing technologies, such as CMOS technologies, a great deal of effort has been expended towards reducing the energy required to program a phase change memory. Nevertheless, significant currents are required to program the devices. As a result, the current sources that supply programming current to the devices are typically quite robust. In order to supply the relatively large currents required to program the devices, the current sources typically employ large, high current-capacity, active devices that occupy a significant amount of chip area—"real estate." A method and apparatus to reduce the size of active devices employed within a phase change memory programming current source would therefore be highly desirable to reduce cost by reducing related chip area. For clarity and brevity of description, the following discussion will be limited to binary phase change memories, but multi-level phase change memories are contemplated within the scope of the invention. The distinct electrical characteristics are associated with two different crystallographic structures of the material forming the memory element. An amorphous, disorderly, phase is associated with a relatively high resistivity and a crystalline or polycrystalline phase is associated with a relatively low resistance. The techniques described herein may be extended to any variable resistance technology by those reasonably skilled in the art.

SUMMARY OF THE INVENTION

A system and method in accordance with the principles of the present invention employs a low-level current source to access (that is, READ, SET, or RESET) a phase change memory cell. By memory cell, we mean a portion of phase change memory material (also referred to herein as Ovonic Universal Memory, OUM). Each memory cell may have associated with it contacts, and may also have an associated access or select device. A low-level current source charges an access capacitor in order to store sufficient charge for an ensuing access. By low-level current source, we mean a current source of lower capacity than required for the associated access operation. When a memory cell is accessed, charge stored on the capacitor (in addition to the current from the current source) is discharged through the phase change memory, supplying a current to the phase change memory cell that is greater than that provided directly by the current source.

The voltage impressed across the access capacitor may be tailored to the type of access being carried out so that, for example, a relatively low voltage is applied to the capacitor in order to charge it for a READ operation. Higher voltages are applied for both the SET and RESET operation in order to ensure that the threshold voltage of the cell is met and the cell is operating in its programming region to achieve the desired state to be written. To improve margin, a switchable capacitor may be added to the column line being charged.

A plurality of current sources may be employed in a phase change memory in accordance with the principles of the present invention, at least one of which is of a capacity that is insufficient to directly provide current for the associated memory access operation, such as less than the current necessary to reset the bit. This current may be adequate or nearly adequate as an amplitude to program a set bit but not a reset bit.

A current source in accordance with the principles of the present invention may be configured to charge an access capacitor over a period of time that is less than or greater than the discharge period associated with the device's corresponding access operation.

In an illustrative embodiment, additional impedance may be switched in to the access capacitor circuit in order to thereby increase the discharge time of the capacitor circuit, such as for a SET operation, for example. In an illustrative embodiment, the access capacitor is the line capacitance associated with a memory array's interconnection conductors and supplemental capacitance may be either discrete capacitance (provided, for example, by an "on-chip" MOS capacitor) or the additional line capacitance of adjoining memory blocks.

A single current source may be used to charge an access capacitor for both SET and RESET operations. In both cases a relatively low-level charging current charges the access capacitor. For a SET operation, the access and supplemental capacitor are discharged into the memory cell of interest and the RC time constant of the access capacitor (in combination with the line resistance and contact resistance associated with the phase change memory cell) limits the discharge over an extended period of time to ensure that the memory cell is SET. To further extend this time, the current source may continue to run with a slow turn-off after the memory has thresholded. For a RESET operation, the access is charged and discharged as just described, except that the discharge period is engineered to assure rapid cooling upon termination of the write current, to ensure that the phase change material rapidly cools to the amorphous state. To help assure a fast trailing edge, the supplemental capacitor may be disconnected after discharge, the current source turned off with a fast trailing edge, and/or turning on an active parallel quench transistor to assure a fast trailing edge decay of the column voltage.

BRIEF DESCRIPTION OF THE DRAWINGS

FIGS. 3A and 3B are simplified schematic diagrams representative of memory access circuits in accordance with the principles of the present invention;

DETAILED DESCRIPTION

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Accordingly, the scope of the invention is defined only by reference to the appended claims.

Figure 1:
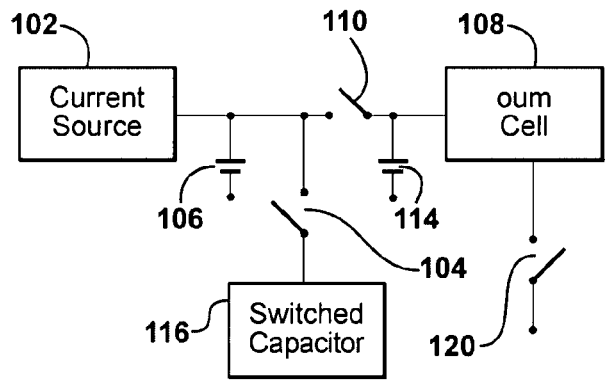
FIG. 1 is a conceptual block diagram of a phase change memory access circuit in accordance with the principles of the present invention.

The conceptual block diagram of FIG. 1 illustrates the basic components of phase change memory 100 in accordance with the principles of the present invention. In accordance with the principles of the present invention, a current source 102 is optionally connected through a switching element 104 to a switched capacitor 116. In addition, an access capacitor 106 is attached to the current source 102. Additional supplemental capacitance, here indicated by 116, may be attached by access switch 104, such as when writing a bit to the set state. The current source 102 charges the access capacitor 106 and switched capacitance 116 (if optionally connected) until sufficient charge is stored at an appropriate voltage for the desired access operation, which may be a READ, SET, or RESET, for example. We refer herein to the time required for a READ, SET, or RESET operation, generally, as "access time" and to the various operations, generically, as an "access." When sufficient charge has accumulated on the access capacitor 106 (and supplemental capacitor 116), it is coupled to a memory element 108 and its associated access capacitance 114 through a switching element 110 and select element 120. The switching elements 110 and 120 may be row and column select switches within a memory array and may be implemented using diodes (MOS or bipolar), field effect transistors (FETs) or three-terminal ovonic threshold switches (OTS), for example. Because the current source 102 stores charge on the access capacitor 106 over a period of time $t_{STORE}$ that is greater than the access time of the OUM cell, $t_{ACCESS}$ the current source needn't have the current capacity to directly drive the access operation of interest. The sequence may vary. As one alternative, the switching element may connect the current source to the selected cell (such as through its column) in parallel with connecting to the switched capacitor. And the cell may be selected, such as by enabling row access by closing switch 120 either at that time, or later after a sufficient voltage is reached across the capacitors to enable the process (e.g., writing or reading).

That is, a phase change memory in accordance with the principles of the present invention employs at least one current source having a capacity less than that required for the corresponding access operation. For example, a READ current source in accordance with the principles of the present invention may be configured to supply only a fraction of the current required to READ a SET phase change memory or, similarly, a RESET or SET current source may only be capable of supplying a fraction of the current required to perform their respective operations.

The current source 102 may be implemented as a plurality of current sources, with specific sources dedicated to each access operation or a single current source may be used for a plurality of access operations. Accordingly, the access capacitor 106 must have sufficient charge storage capacity to supply the requisite current over the access period, $t_{ACCESS}$ or to provide enough supplemental current so that, in combination with the current source 102, sufficient current is supplied to the phase change memory element 108 throughout the access period. In illustrative embodiments, the current source 102 has the capacity to provide less than 90%, less than 50%, or for example 10% less than the current required for a direct access operation.

A memory in accordance with the principles of the present invention may employ a hierarchical architecture in which blocks of memory are distributed in an array. In an illustrative embodiment, each block of memory and each bit within the block may be accessed through row and column address buffers and decoders. Information (data or control code, for example) targeted for writing to memory cells within the array may be stored within data buffers then written to the cells in a manner described in greater detail below. Sense amplifiers may be employed to read information from memory cells within the array and to then store the information in data buffers for presentation "off-memory."

Decoded addresses, in combination with signals such as READ, SET, and RESET, may be employed to route the appropriate current source to a selected memory cell. In accordance with the principles of the present invention, at least one of the current sources (READ, SET, RESET) is configured to charge an access capacitor that, in turn, supplies current for the corresponding operation (e.g. READ, SET, or RESET).

Figure 2:
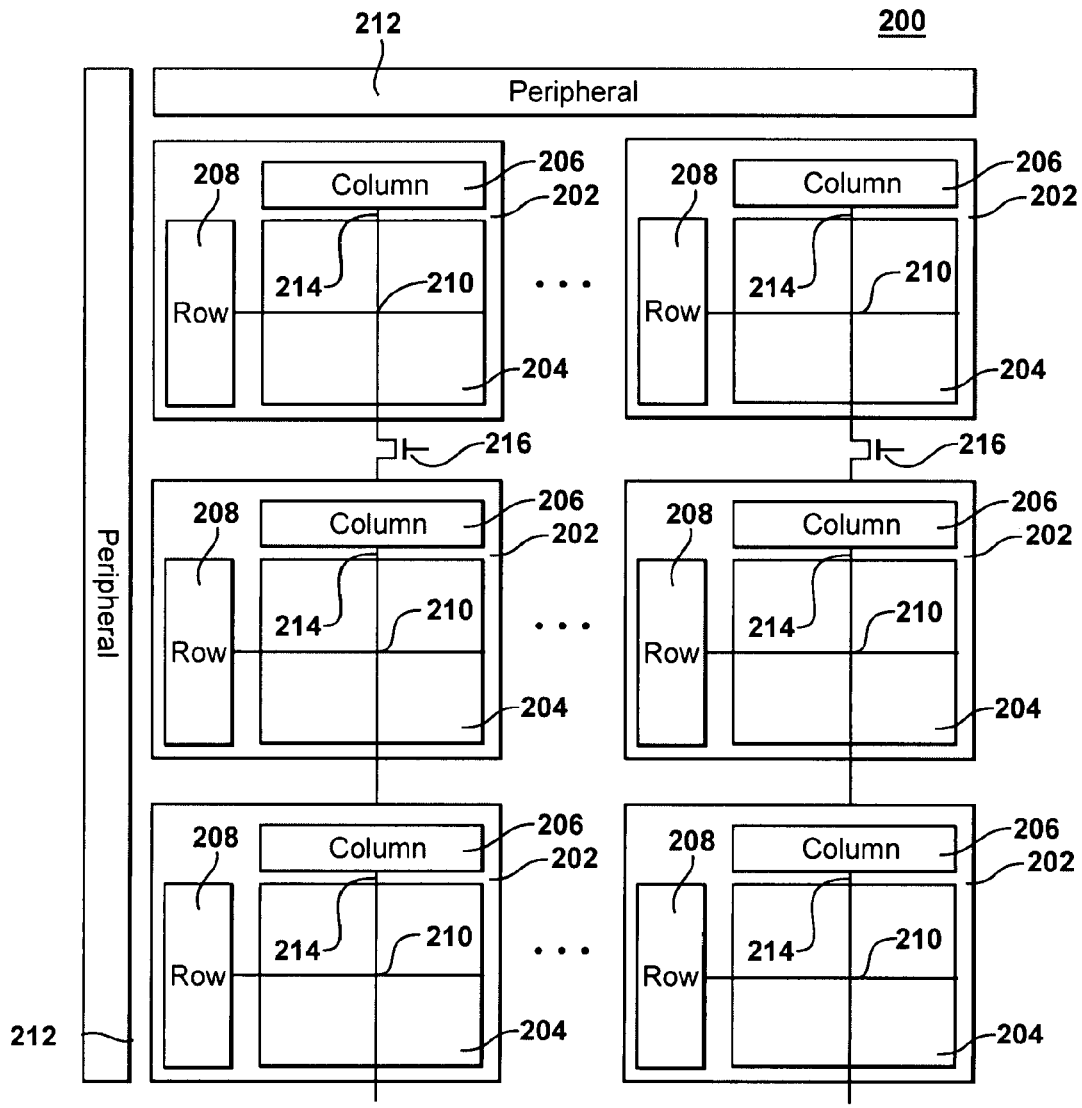
FIG. 2 is a more detailed conceptual block diagram of a hierarchical memory array in accordance with the principles of the present invention.

In the conceptual block diagram of FIG. 2 a memory 200 is organized in an 8×8 array of 64 memory blocks 202. Each block includes an array of memory cells 204 and peripheral circuitry that includes column 206, and row 208 access circuitry that provide access to individual memory cells 210 within each block 202. Peripheral array circuitry 212 includes row and column decoders and drivers, data and address buffers, sense amplifiers and current sources. The peripheral array circuitry 212 provides top-level decoding for access to the memory blocks 202, and switches/enables the appropriate read- or write-buffers, sense amplifiers, and current sources into a selected memory block 202. Each column line 214 within a block may typically exhibit line resistance and capacitance of 2 k• and 1 pF, respectively.

Within each block of memory, ADDRESS DECODE, READ, SET, and RESET signals are used to determine which bit to access and which operation to perform on the accessed bit. In this illustrative embodiment, the memory employs different current/voltage sources for each operation, and, therefore, it predetermines not just whether the bit is to be read from or written to, but, additionally, if it is being written to, whether a SET or RESET is to be performed. In an illustrative embodiment, supplemental switches 216 may be employed to connect column lines from one or more adjoining memory blocks in order to increase the charge storage capacity of an access capacitor in accordance with the principles of the present invention. Such an operation is described in greater detail below.

Each column 300 within a memory block may be modeled as in FIG. 3A. In this illustrative embodiment, we assume the column 300 has been selected via decoding logic previously described. The column select device 302 couples a current source 304 to a column of memory cells 306.

Decode logic will have selected the appropriate current source 304 to couple through the select device 302 for the operation at hand. Each memory cell 306 has associated with it a phase change memory element (OUM) 308, row (word line) select device 310, line resistance 312, and line capacitance 314. Each OUM 308 has a contact resistance 311 associated with it. Because only one cell along a column will be accessed at a given time, we can simplify the model to that of FIG. 3B, with the column select device 302, OUM 308, row select device 310, line resistance 312 (2 k•), and line capacitance 314 (1 pF). In this illustrative embodiment, the line capacitance 314 operates as the access capacitor for the memory cell. That is, when coupled to a memory cell through the column select device 302, the current source 304 charges the line capacitance 314. As described in greater detail below, optional supplemental capacitance 313 may be switched into the access capacitor circuit using a switch 311 which is analogous to switch 104 in FIG. 1.

Subsequently, when a row select device 310 is activated, the charge on the line capacitance 314 is discharged through the selected OUM 308 to effect the desired operation (e.g. READ, SET, or RESET). In accordance with the principles of the present invention, the line capacitance 314 may be charged over a greater period of time than the OUM's access time. Therefore, the current source 304 may be of reduced capacity when compared to a current source tailored to directly produce the current necessary for the access operation. Or, the current source may be connected at the start of the (read or write cycle) to the cell and supplemental capacitance 313 connected by switch 311 during the cycle. The supplemental capacitance provides additional current available to assist the cycle. Further, the row select may be delayed until a higher voltage is reached to provide additional current. By these means the column driver may be reduced.

The row and column resistance 311 and 312 will vary with position of the selected cell on the array. To better control the resulting discharge rate (trailing edge quench) to be slow or fast, additional resistance may be switched into the discharge path, such as in series with the source of 310. Such beneficial techniques are described, for example, in U.S. Pat. No. 6,480,438 issued to Park, which is hereby incorporated by reference.

In an illustrative embodiment in which the cell access device is a MOS transistor, the resistance of the memory element is tailored to bias the transistor to deliver peak power by adjusting the resistance 311 of the OUM's contacts. When the phase change material is in the amorphous state it would appear that its resistance is too high to allow passage of any current to heat the memory element for a phase transition. However, when an electric field of approximately $3 \times 10^5$ V/cm is applied, Poole-Frenkel conduction combined with the device heating lowers the material's resistance and it switches into a low impedance polycrystalline state, which persists until after the pulse is removed and the material cools.

To ensure that the memory device can heat up during a write operation, while it is in the amorphous state, the write pulse must have a sufficiently high potential to cause this switching. To avoid inadvertently SETing or RESETing a device during a READ operation, the applied potential is limited so that fields of this magnitude are not present during a READ. Generally, the maximum field the memory element can experience is determined by the voltage applied to the memory array, but this voltage may be boosted using known means, such as charge pumps, for example. The row and column circuitry controls the current through the device.

To set the device to 0, (SET state) the applied voltage must be high enough to ensure that the alloy will switch into the low impedance state. The access transistor may be biased to an intermediate current level that will heat the material significantly, without melting it. The duration of the set pulse must be sufficiently long to permit nucleation and growth of crystallites. Typically, because the bit to be written may be in the reset state, the applied voltage will be greater than the threshold voltage of the device Vth, which may be, for example, depending upon device composition and structure, approximately 1.1V.

To set the device to 1, (RESET state), the applied voltage must be high enough to ensure that the possibly reset alloy will switch into a low-impedance state. The access transistor may be biased to allow sufficient current to heat a portion of the material above its melting temperature. If the current is removed rapidly, e.g. less than 5 nsec, the small volume of material that has melted will rapidly turn into an amorphous state, typically in less than 2 ns. Again, typically, the applied voltage will be greater than the threshold voltage of the device Vth, which may be, for example, approximately 1.1V.

For read operations the electric field must be limited by applying a low voltage to the device. When the access transistor is turned on only a small current will pass if the material is RESET to the amorphous state, due to its high impedance. If the material is set to the crystalline phase, the applied voltage and the resistance of the contact will limit the current through the device. In accordance with the principles of the present invention, the applied read voltage will be substantially less than the threshold voltage (e.g. approximately 0.4V).

1. Reading a Cell

Figure 4:
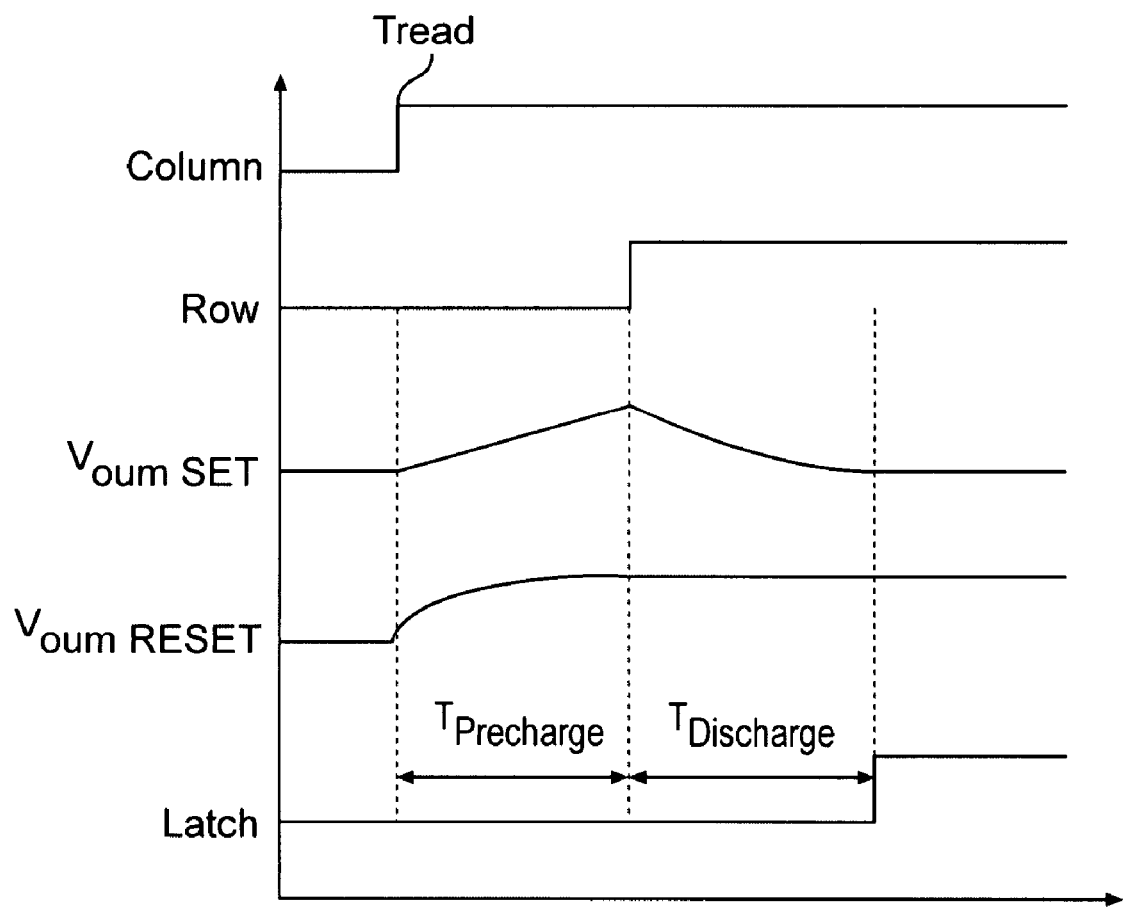
FIG. 4 is a timing diagram of a READ operation in accordance with the principles of the present invention.

The timing diagram of FIG. 4 illustrates the timing of a READ operation. Initially, neither the column access line nor the row access line is activated and, therefore, the column line is "floating," but may be pulled to ground through leakage current. Or, for a 2 terminal select device (such as a diode or OTS), the row and column may be biased at a common voltage, such as at ground or midpoint between the array power supply. Alternately, the deselected column lines may be biased at or near ground, and the deselected row lines may be biased at or near (within minimum Vth, such as 0.6V) the peak column voltage (to assure the deselect device remains off when not selected. When a read request is received, the READ, SET, RESET, and COLUMN signals are decoded to connect a READ current source and the input of a sense amplifier to the column selected by the column decoder through the column access device, as indicated by the signal COLUMN going HIGH at $T_{READ}$. If we assume that the initial voltage $V_{OUM}$ at the node connecting the column line to the OUM device is at ground potential, the line capacitance charges from zero to a READ voltage level. Such charging is indicated by the two traces $V_{OUMSET}$ and $V_{OUMRESET}$, which correspond, respectively, to $V_{OUM}$ for a device that is SET and to a device that is RESET. At time $T_{READ}$, the column select line is activated, coupling the READ current/voltage source to the line capacitance through the line resistance. Although the resistance "seen" at each memory cell looking back at the current/voltage source will vary along the column line, we assume that the entire line capacitance (1 pF) is charged and, therefore, the appropriate resistance is the entire line resistance (2 k•). For a READ operation, the line capacitance is charged to a "safe" voltage, below the expected minimum threshold voltage for the entire memory array. In an illustrative embodiment, the output voltage of the READ current source is limited to a $V_{SAFE}$ of no more than 0.4V. Such charging may also be done with precharge voltage in parallel with the read current source.

After a pre-charge period $t_{PRECHARGE}$ determined by the current available from the read current source or parallel voltage source; the row access select FET is asserted, changing the state of the OUM cell from "floating" to "grounded" through the row access FET. In order to avoid programming the OUM while attempting to read it, current through the OUM must be limited to a value, $I_{SAFE}$ that is less than a minimal programming current. If the OUM is RESET, limiting current through the device is not a concern. If the OUM is SET, the peak current may be limited by the line resistance $R_{LINE}$ set resistance of the OUM $R_{SET}$, and contact resistance of the OUM $R_{CONTACT}$. For example, if the capacitor $C_{LINE}$ is charged to a voltage $V_{SAFE}$ of 0.4V, the line resistance $R_{LINE}$ is 2 k•, the OUM SET resistance $R_{SET}$ is 5 k•, the device contact resistance $R_{CONTACT}$ is 3 k•, the resultant peak output current $I_{PEAK}$ would be 40 μA. Additional current-limiting may be provided by modulation of the gate-to-source voltage, $V_{GS}$, of the row selector FET. The line capacitance is allowed to discharge for a period $t_{DISCHARGE}$ corresponding to the time required to discharge a SET OUM to a voltage level recognizable as a SET output. This time may be selected, for example, as the time required for the OUM output voltage $V_{OUM}$ to fall to 37% of its initial value (e.g., 37% of 0.4V, or 0.148V) corresponding to the cell's time constant $(R_{LINE}+R_{SET}+R_{CONTACT})(C_{LINE})$.

After the discharge period $t_{DISCHARGE}$ that permits the line capacitance to discharge to a voltage indicative of a SET condition, the output of the sense amplifier is assumed to be a stable indicator of the state of the OUM cell. Consequently, the output may be latched as a valid output by asserting the signal $R_{LATCH}$. The total delay for accessing the device $t_{DELAY}$ would, therefore, be a combination of $T_{PRECHARGE}$ and $T_{DISCHARGE}$. If the cell had been SET, the line capacitor would have discharged and a SET voltage level would be latched into the memory output. If cell had been RESET, the line capacitor would not have discharged in the allowed read access time, and a RESET voltage level would be latched into the memory output.

Other variations are possible as will be clear to those reasonably skilled in the art. Readout methods are disclosed, for example, in published United States Patent applications 20060227590, 20060227592, 20060279979, and 20060233019 having inventor Ward Parkinson et al, which are hereby incorporated by reference. A current equal to less than the required set or reset current may be forced into the selected column (either to precharge or after precharging to a selected voltage). In an illustrative embodiment, the current source is switched into the column line associated with the memory cell to be read after the column line has been discharged to 0V. The memory cell's row select line may then be asserted using, for example, an access transistor, a diode, or OTS. Once the row select line is asserted, the current from the current source is divided between charging the access (and any supplemental) capacitance and the memory cell itself. If the memory cell is in a low-impedance SET state, the access capacitance will charge to a lower Vfinal(set), and hence slower to a voltage near that Vfinal(set). If the memory cell is in a high-impedance RESET state, the access capacitance will charge relatively more rapidly. The difference between the SET and RESET states may be readily detected by sampling the voltage at the input node of the memory cell a short time after the row select line is asserted. For, example, after a limited time, if the column voltage across the memory element reaches 0.2V, the bit is presumed RESET and the read current turned off. For example, if the column voltage across the memory element, when loaded with 1 pf and driven by 10 ua, reaches 0.2V in less than 20 nsec, the bit may be reset. Otherwise, the bit is presumed set and the current turned off.

To reduce delay when using a 2 terminal select device (such as a diode or OTS), the column may be precharged to near the turn-on or threshold respectively of the diode or OTS. For example, with a diode, the column line voltage may be precharged to 0.7V. Then, the voltage source turned off, the read current enabled to the selected column, and the time-out started to determine if significant voltage develops across the memory element (more than 0.2V if the bit is reset).

2. Setting a Cell

Figure 5:
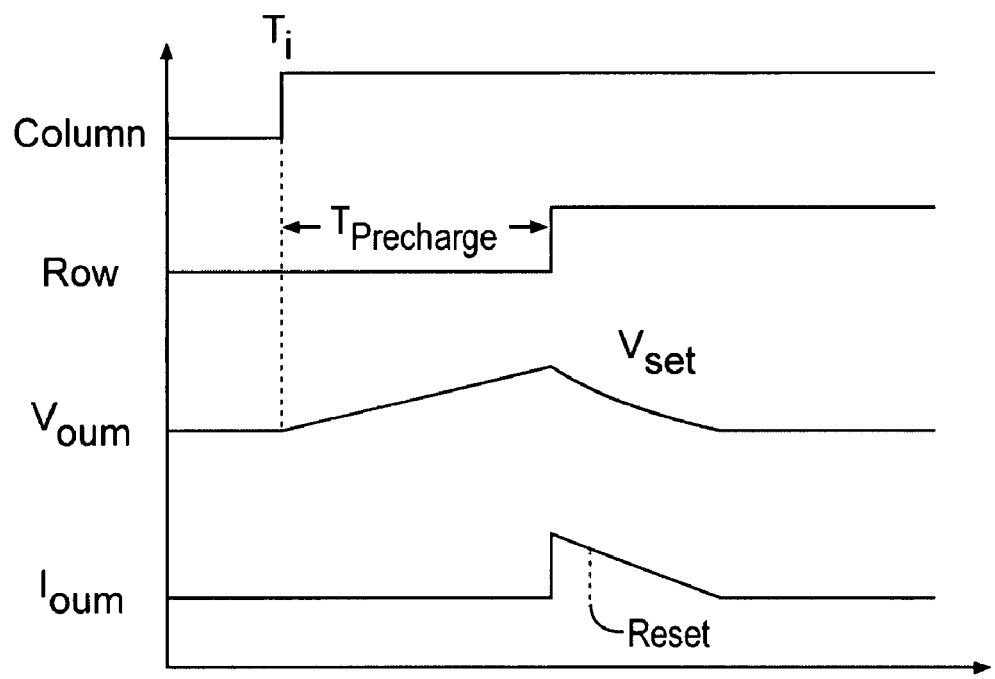
FIG. 5 is a timing diagram of a SET operation in accordance with the principles of the present invention.

The timing diagram of FIG. 5 illustrates the timing of a SET operation. Initially, neither the column access line nor the row access line is activated and, therefore, the column line is "floating," but may be pulled high or low through leakage current, or to a fixed voltage by a pre-charge voltage. When a SET request is received, the READ, SET, RESET, and address signals are decoded to connect a SET current source to the selected column through the column access device, as indicated by the signal COL going HIGH at $T_{SET}$. If we assume that the initial voltage $V_{OUM}$ at the node connecting the column line to the OUM device is at ground potential, the line capacitance charges from zero to a SET voltage level. Such charging is indicated by the trace labeled $V_{OUM}$. Because an OUM device is programmed when it is in its highly conductive region of operation, the initial state of the device, whether SET or RESET, has no bearing on the SET operation.

At time T1, the column select line is activated, coupling the SET current/voltage source to the line capacitance through the line resistance $R_{LINE}$. For a SET operation, the line capacitance is charged to a voltage above the OUM cell's threshold voltage to ensure that the device switches to its conducting state and to ensure that sufficient current is available to program the cell to a SET state. In an illustrative embodiment, the output voltage $V_{SET}$ of the SET current source is selected to be 3.0V. Alternately, the voltage Vset may be precharged by a voltage source to 3V, then the voltage source turned off, and a 200 ua current source turned on.

After a pre-charge period $t_{PRECHARGE}$ determined by the current available from the SET current source (e.g. a 200 μA current would result in a 3.0V rise on a 1 pF cap in less than 15 ns), the row access select FET is asserted thereby pulling the OUM cell low through the row access FET. The initial current through the OUM cell would then be limited by the line resistance $R_{LINE}$, dynamic "on" programming resistance, dV/dI, of the OUM $R_{PROGRAMMING}$, contact resistance of the OUM $R_{CONTACT}$, and "on" resistance of the cell select device. For example, if the capacitor $C_{LINE}$ is charged to a voltage $V_{SET}$ of 3.0V, the line resistance $R_{LINE}$ is 2 k•, the OUM PROGRAMMING resistance $R_{PROGRAMMING}$ is 1 k•, the device contact resistance $R_{CONTACT}$ is 2 k•, and select device resistance is 1 k• the resultant peak transient current $I_{PEAK}$ would be approximately 500 μA. The $I_{final}$ will be the current from the current source connected to the column. Additional current-limiting may be provided by modulation of the gate-to-source voltage, $V_{GS}$, of the row selector FET. When using a 3 terminal select device, such as an n-channel FET, the select resistance may be modulated by using a relatively higher or lower gate voltage for Von. When using a 2 terminal select device, the select voltage may be modulated by using a relatively lower or higher gate voltage when row selecting the cell; that is its gate voltage higher or lower during select). The amount of current is determined by the voltage across the device when the OUM is triggered, so the peak current may also be adjusted by raising or lowering the column voltage before turning on the row select.

In order to SET the cell, the phase change material is brought to a crystallization temperature, above 200° C., where there is a rapid nucleation of the crystallites, and kept at that temperature for a period to allow the phase change material to become crystalline. Crystal growth rate is a strong function of temperature. The optimum temperature for crystal growth, referred to as the "nose temperature," may be determined through known means. Knowing the nose temperature, the SET current may be optimized to limit the period of time the phase change material must be held above the crystallization temperature and, concomitantly, the period of time a SET current must be applied to the phase change material in order to SET the cell.

In an illustrative embodiment, a memory in accordance with the principles of the present invention employs a SET current exhibiting a sloped falling edge, referred to as a SET sweep current, to SET each cell. The SET current pulse amplitude may exhibit an initial peak current level comparable to that used for the RESET operation with a trailing edge that sweeps down in a controlled sloped fashion to crystallize (i.e. SET) the phase change material in the cell. A SET current pulse with an initial amplitude equal to that of the RESET current for the cell and a fall time adjustable between 5 ns and 200 ns may be employed to SET a cell in accordance with the principles of the present invention, where the fall time is adjusted to meet the slope requirements for the alloy selected.

In this illustrative embodiment, with the duration of the current pulse limited solely by the discharge of the line capacitance through the OUM and saturated row select FET, the current will fall to 37% of its initial value to equal the current from the current source during one time constant, $R_{TOTAL}C_{LINE}$, where $R_{TOTAL}=R_{LINE}+R_{PROGRAMMING}+R_{CONTACT}+R_{SELECT}$, which, given the above resistance and capacitance values, yields a time constant of about 6 ns. Typically, this is not enough time to properly SET the memory cell. In order to ensure that the phase change material crystallizes, the SET pulse may be extended, for example, by using a lower gate voltage for the row select FET to limit the discharge of the line capacitance. The FET may be biased, for example, to allow sufficient initial programming current to flow but to also increase the resistance to a level that discharges the line capacitance gradually enough to allow for crystallization of the phase change material. The control voltage of the FET (either within the cell (if a 3 terminal select device such as a FET) or the row driver (if a 2 terminal select device such as a diode or OTS) need not be a held to a steady value. That is, the control voltage may be initially asserted at maximum gate voltage Von (Vgs) in a manner that allows the maximum possible current and decreases resistance of the select device to be discharged from the capacitor during a RESET pulse, in order to achieve the heating required of the phase change material. However, the gate voltage may be adjusted to lower the initial current and increase the resistance for writing SET. Thus, the control voltage may be modified to increase the cell resistance in order to extend the period of time that the phase change material is held at or above the crystallization temperature. For example, if the cell access device is an n-channel FET, a row select gate voltage in the form of a mid-level gate voltage may be applied to initially to permit lower the peak discharge current and slow the rate of discharge by increasing the cell resistance. Then, the select gate voltage may be increased to full voltage.

In addition to or instead of controlling the gate voltage of the cell select FET (or row select driver if a 2 terminal select device is used), a slower trailing edge quench slope for writing the bit to SET may be achieved by tailoring the current source to turn-off with a relatively slow and relatively linear slope. That is, the FET in the cell or row driver may be turned on with a either a full or relatively lower gate Von voltage to select and trigger on the memory (if in the reset state). Then, simultaneously with or about the same time the transient current decays away (or some delay later), the current source may be successively decreased in current linearly or in small (e.g. preferably less than 10%) steps that approximate a linear ramp achieved in steps down in current, with the ramp rate decreasing the current adjustable from 10 nsec to 250 nsec over the period from 90% to 10% of current source current, depending on the write Set speed slope of the alloy selected. By increasing the cell resistance, the initial peak current relative to the current source is less but decays to the level of current from the current source slower (due to higher resistance in the path). Then, the current source may be decreased to achieve the final ramp of turning off (quenching) the programming current to the bit written to the SET state.

In accordance with the principles of the present invention, the period of a SET current pulse may be extended by increasing the RC time constant associated with discharging the READ/WRITE capacitance. Increasing the RC time constant may be effected by, for example, by increasing the capacitance and/or resistance in the READ/WRITE capacitance' discharge path. Such RC time constant increases in the access discharge path may be permanent or controlled. A permanent RC time constant increase may, for example, be implemented by increasing the dielectric constant of materials underlying the column line in order to increase the line capacitance. A controlled RC time constant increase may be implemented, for example, by switching a discrete on-chip device, such as a MOS capacitor, onto the access capacitance discharge path, or by switching in the line capacitance (and associated line resistance) of one or more additional on-chip memory blocks. If the supplemental capacitance is permanently connected to the current source and not switched in only for writing, there will be a tradeoff between the capacity of the current sources (i.e. READ, SET, and RESET) and the respective precharge times. The advantage of the permanent approach is simplicity; the potential drawback is an increase in the time associated with charging the access capacitance prior to a read or write operation. The "temporary" approach, whereby impedance is switched into the access capacitance discharge path to increase the discharge time constant in order to extend a program pulse for SET operations, has the advantage of not increasing the precharge time for a RESET operation.

In an illustrative embodiment, a single programming current source may be employed for both the SET and RESET operations. In such an embodiment, the access capacitance is pre-charged to the same voltage and discharged. However, for a RESET programming pulse the row access device abruptly cuts off current flow through the phase change cell to ensure rapid quenching and amorphization of the cell. In addition, a quench transistor may be added to each column line which is turned on to accelerate the trailing edge of a reset pulse, and such quench transistors may be undecoded. When current through the phase change cell is abruptly terminated in this fashion, the access capacitance may then be discharged through an alternative shunt path, via a separate quench switch transistor, for example. Although separate SET and RESET current sources may be employed, with an embodiment that employs permanent supplemental capacitance, all time constants, READ, SET, and RESET will be extended and, consequently, RESET current pulses will be quenched to produce a RESET pulse that better ensures amorphization of the phase change material.

If the additional impedance needed to increase the access capacitor's discharge time for writing SET is switched into the circuit, neither the READ nor the RESET current source (or their respective the pre-charge times) will be affected. In accordance with the principles of the present invention, a discrete MOS capacitor, such as capacitor 313 of FIG. 3B, may be used to increase the write current and extend the RC time constant of a memory cell, and thereby slow the trailing edge rate of the current pulse through the memory cell in order to make it suitable for a SET operation. MOS capacitors are known and described, for example, in U.S. Pat. Nos. 4,453,090; 5,008,799; 5,544,102; and 7,196,379, which are hereby incorporated by reference. In an illustrative embodiment, each memory block has associated with it a MOS capacitor that may be switched in to the column line circuit to provide sufficient SET programming time. In this illustrative embodiment, a single SET current source supplies SET current to all or certain cells within the block, and a combination of the SET signal and the connection of the current source to a column line selected (by the decoder) within the block also couples the MOS capacitor to the SET current source and selected column line. One or more current sources may be used to drive one or more bits in a block, for writing in parallel, and each current source may have an associated supplemental capacitor that is permanently or selectively switched into and coupled to the current source (and thus the column line selected (by the column decoder) to be driven by the current source).

Referring to the previous example in which a 1 pF line capacitance yielded approximately a 6 ns pulse, the addition of a 10 pF MOS capacitor would extend the pulse to about 60 ns, for example. As previously discussed, this capacitance may be switched into the circuit only for SET operations. Then, only the pre-charge time for a SET operation will be affected, and accommodation for this increased pre-charge time may be made by increasing the size of the SET current source and/or accepting a longer SET pre-charge period. Alternately, the node may be pre-charged by a voltage source, and then the voltage source turned off as the current source is turned on (in parallel with turning the row select).

In accordance with the principles of the present invention, a combination of the SET signal and activation of any column line within a column of memory blocks may be used to couple the line capacitance from the column or row line(s) of one or more adjoining memory blocks onto the selected column line to thereby increase the time constant of the circuit providing current to a particular memory cell, by increasing its capacitance when writing SET. One or more switches such as FET 216 of FIG. 2 may be employed to switch line capacitance from adjoining, unselected, memory blocks into the circuit for a cell that is to be SET. Returning to the previous example, switching the column line capacitance from an additional seven memory blocks increases the time constant from about 6 ns to about 50 ns (by increasing the load capacitance from 1 pF to 8 pF line capacitance). The transient current added to the write current source is similarly increased. Thus, this technique may also be used with a reset, so long as provision is made to reduce the trailing edge rate, such as by disconnecting the switched in capacitance after the transient, and/or forcing the row line to rapidly equal the column line, or turning on a quench transistor to force the column line down to equal the row line (or all of the above).

The amount of additional capacitance to switch in to the circuit to extend a SET current programming pulse may be tailored to the requirements generated by a specific device composition and structure. With rapid-crystallizing materials, for example, a shorter SET period may be acceptable. In such an embodiment, a memory system in accordance with the principles of the present invention may switch the bit-line capacitance of a lesser number of memory blocks in to the SET programming current circuit. For example, the column line capacitance of an additional three memory blocks would stretch the circuit's time constant to 44 ns ($R_{LINE}$=8 k•, $R_{CONTACT}$=3 k•, and $C_{LINE}$=4 pF), which may be a sufficient period of time for fast-SETTING devices.

The amount of capacitance, and/or current source amplitude, and/or amount of supplemental capacitance, and/or the current source trailing edge rate of decay may be programmable die to die, wafer by wafer, or within a die (block by block)—either by mask, probe (such as by puncturing a dielectric), or laser through techniques familiar to those reasonably skilled in the art.

3. Resetting a Cell

Figure 6:
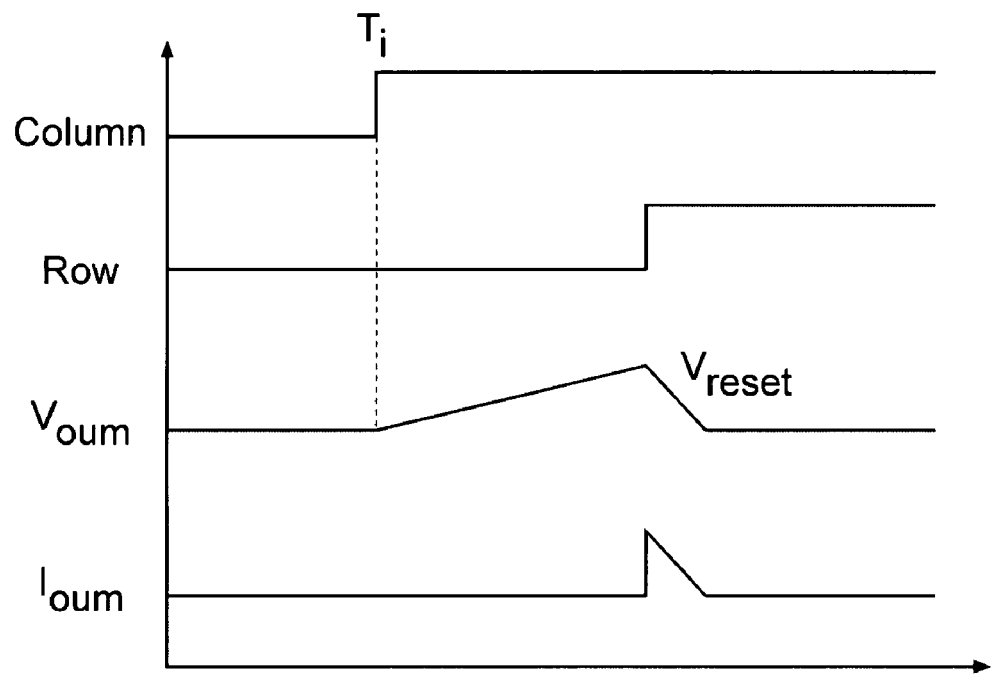
FIG. 6 is a timing diagram of a RESET operation in accordance with the principles of the present invention.

The timing diagram of FIG. 6 illustrates the timing of a RESET operation. Initially, neither the column access line nor the row access line is activated and, therefore, the column line is "floating" or precharged to a selected voltage—for example midpoint or ground. When a RESET request is received, the READ, SET, RESET, and COLUMN signals are decoded to connect a RESET current source to the column through the column access device, as indicated by the signal COL going HIGH at $T_{RESET}$. The initial voltage $V_{OUM}$ at the node connecting the column line to the OUM device may be at ground potential, midpoint, or positive array voltage (VCC or a regulated or pumped voltage Varray). If at ground, the selected column line capacitance connected (by the decoder) to the column current source charges from zero to a RESET voltage level. Alternately, a voltage source may be used to pre-charge the selected column to the active write voltage (Vreset). Such charging is indicated by the trace labeled $V_{OUM}$. Because an OUM device is programmed when it is in its highly conductive region of operation, the initial state of the device, whether SET or RESET, has no bearing on the RESET operation.

At time T1, the column select line is activated, coupling the RESET current or voltage source to the line capacitance through the line resistance $R_{LINE}$. For a RESET operation, the line capacitance is charged to a voltage above the OUM cell's threshold voltage to ensure that the device switches to its conducting state and to ensure that sufficient current is available to program the cell to a RESET state. In an illustrative embodiment, the output voltage $V_{RESET}$ of the RESET current source is selected to be 4.0V. In embodiments where memory circuits operate from lower-level supply voltages, a charge pump or other known means may be employed to provide the higher, e.g. 4.0V supply.

To assure the cell does not prematurely turn on with a 2 terminal select device in the cell, the row lines can be charged and maintained within Vth of the final value of the column line. Similarly, the column lines may be pre-charged to 0V when the block is inactive (until access for read or write is desired). Then, the column current source may be connected to the selected column to charge it high (from ground), a pre-charge voltage connected to charge the column high. If, for example, an N-channel FET is used within the cell as the select/isolation device, the row line driving the parallel gates on the row may be held at ground, and only raised after the Column has been pre-charged, such as to 4 V, and then activated at Row time, shown in FIG. 6 by the Row going from low to high. If a voltage source is used for the pre-charge, the voltage source may be first turned off and a current source turned on before the row is selected A pre-charge voltage source may be used to force a fixed voltage, such as 4.0V on the selected column line. Or, a current source may be used to charge the selected line to 4.0V. After a pre-charge period $t_{PRECHARGE}$ to force the selected column line to, for example, 4V, the row access select FET is asserted, changing the state of the OUM cell from "open" or "floated" to "grounded" through the row access FET in the memory cell. Alternately, if a 2 terminal select device is used, such as a diode or OTS device, the row line is asserted by pulling the line low, such as to ground. This row assertion is shown in the timing diagram of FIG. 6 by Row going high after Column has been pre-charged starting at T1 time.

The initial current through the OUM cell would then be limited by the line resistance $R_{LINE}$, dynamic programming resistance of the OUM (dV/dI), contact resistance of the OUM $R_{CONTACT}$, and Ron for the memory cell access device (plus the row driver resistance if a 2 terminal select device is used). For example, if the capacitor $C_{LINE}$ of 1 pF is charged to a voltage $V_{SET}$ of 4.0V, the line resistance $R_{LINE}$ is 2 kΩ, the OUM PROGRAMMING resistance $R_{PROGRAMMING}$ is 1K Ω, the device contact resistance $R_{CONTACT}$ is 2 kΩ, and $R_{on}$ for the select device is 1 kΩ, the resultant peak output current $I_{PEAK}$ would be approximately 800 µA. The $I_{final}$ will be the current from the current source connected to the column, if the node is discharged towards ground. Factoring in a Vh of 1V, the transient current is reduced to about 600 µA plus the current of the current source. Additional current-limiting may be provided by modulation of the gate-to-source voltage, $V_{GS}$, of the row selector FET. The fall time is approximately 1 pF×6 kΩ, or about 6 nsec. If a faster fall time is needed, the row line may be turned off and/or a quench transistor turned on shortly after the row is asserted at Row time in FIG. 6.

In order to RESET the cell, the phase change material is brought to a temperature above the melting temperature and rapidly quenched (for example, during a period of approximately 5-10 ns) to freeze the material in the disordered amorphous state. The melting temperature of the phase change material varies according to the composition of the material. In this illustrative embodiment, the melting temperature may be approximately 610° C. and a RESET pulse has a fall time less than 10 ns. As previously described, when a memory in accordance with the principles of the present invention employs a SET sweep current pulse (i.e. a pulse having a sloped falling edge) a RESET current pulse may be derived from the same current source by truncating the current pulse, such as by turning off the current source in parallel with rapidly turning off the row select, and/or turning on a quench transistor.

In an illustrative embodiment wherein the memory employs a RESET current pulse the duration of which is solely limited by the discharge of the line capacitance through the OUM and row select FET, the current will fall to 37% of its initial value during one time constant, $R_{TOTAL}C_{LINE}$, where $R_{TOTAL}=R_{LINE}+R_{PROGRAMMING}+R_{CONTACT}+R_{On, select device}$; which, given the above resistance and capacitance values, yields a time constant of about 6 ns. Although such parameters vary with the specific phase change material employed, generally, a current pulse of such short duration is suitable for a RESET operation. As previously described, the time constant of such a pulse may be extended, for example, by switching additional impedance into the current discharge path in order to produce a current pulse suitable for a SET operation.

Figure 7:
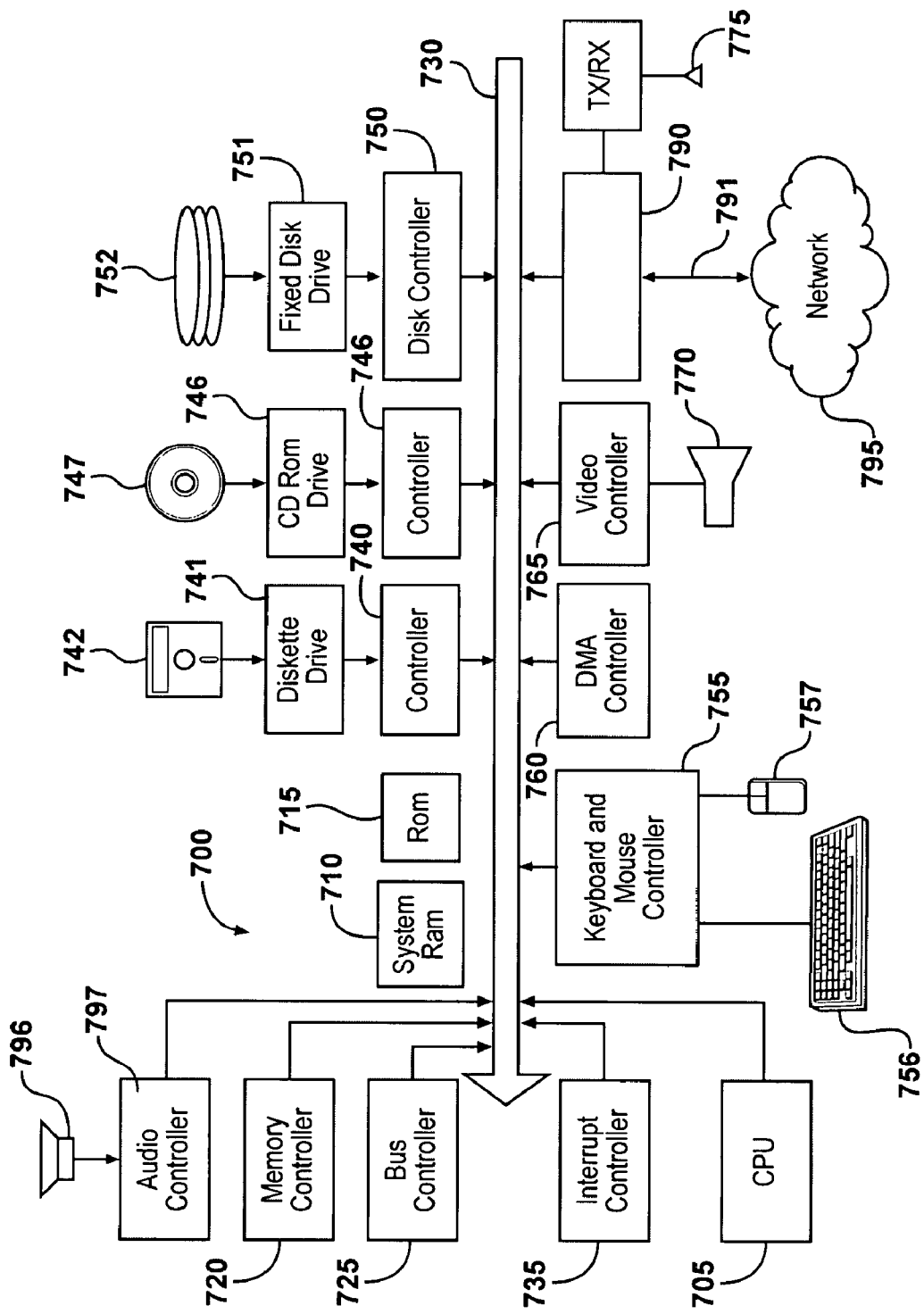
FIG. 7 is a conceptual block diagram of a system that includes a phase change memory in accordance with the principles of the present invention.

Also, to extend RESET (or SET) pulse width, the quench may be delayed if additional pulse width is needed, such as by delaying the turn-off, for example by 5 nsec, the current, row select, and/or quench transistor The phase change electronic device(s) described in the discussion related to the previous figures may be employed to particular advantage in a wide variety of systems. The schematic diagram of FIG. 7 will be employed to illustrate the devices' use in a few such systems. The schematic diagram of FIG. 7 includes many components and devices, some of which will be used for specific embodiments of a system in accordance with the principles of the present invention and others not. In other embodiments, other similar systems, components and devices may be employed. In general, the system includes logic circuitry configured to operate along with phase change memory. The logic circuitry may be discrete, programmable, application-specific, or in the form of a microprocessor, for example. And the embodiments herein may also be employed within the chips or connected to such circuitry. The exemplary system of FIG. 7 is for descriptive purposes only. Although the description may refer to terms commonly used in describing particular computer, communications, tracking, and entertainment systems, the description and concepts equally apply to other systems, including systems having architectures dissimilar to that illustrated in FIG. 7. The electronic system 700, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, or a radio frequency identification device. Any or all of the components depicted in FIG. 7 may employ a phase change memory or chalcogenide electronic device, such as a chalcogenide-based nonvolatile memory or threshold switch, for example.

In an illustrative embodiment, the system 700 may include a central processing unit (CPU) 705, which may be implemented with some or all of a microprocessor, a random access memory (RAM) 710 for temporary storage of information, and a read only memory (ROM) 715 for permanent storage of information. A memory controller 720 is provided for controlling RAM 710. In accordance with the principles of the present invention, all of, or any portion of, any of the memory elements (e.g. RAM or ROM) may be implemented as chalcogenide-based nonvolatile memory.

An electronic system 700 in accordance with the principles of the present invention may be a microprocessor that operates as a CPU 705, in combination with embedded chalcogenide-based electronic nonvolatile memory that operates as RAM 710 and/or ROM 715, or as a portion thereof. In this illustrative example, the microprocessor/chalcogenide-nonvolatile memory combination may be standalone, or may operate with other components, such as those of FIG. 7 yet-to-be described.

In implementations within the scope of the invention, a bus 730 interconnects the components of the system 700. A bus controller 725 is provided for controlling bus 730. An interrupt controller 735 may or may not be used for receiving and processing various interrupt signals from the system components. Such components as the bus 730, bus controller 725, and interrupt controller 735 may be employed in a large-scale implementation of a system in accordance with the principles of the present invention, such as that of a standalone computer, a router, a portable computer, or a data storage system, for example.

Mass storage may be provided by diskette 742, CD ROM 747, or hard drive 752. Data and software may be exchanged with the system 700 via removable media such as diskette 742 and CD ROM 747. Diskette 742 is insertable into diskette drive 741 which is, in turn, connected to bus 730 by a controller 740. Similarly, CD ROM 747 is insertable into CD ROM drive 746 which is, in turn, connected to bus 730 by controller 745. Hard disc 752 is part of a fixed disc drive 751 which is connected to bus 730 by controller 750. Although conventional terms for storage devices (e.g., diskette) are being employed in this description of a system in accordance with the principles of the present invention, any or all of the storage devices may be implemented using chalcogenide-based nonvolatile memory in accordance with the principles of the present invention. Removable storage may be provided by a nonvolatile storage component, such as a thumb drive, that employs a chalcogenide-based nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 740, 745, and 750, for example.

User input to the system 700 may be provided by any of a number of devices. For example, a keyboard 756 and mouse 757 are connected to bus 730 by controller 755. An audio transducer 796, which may act as both a microphone and a speaker, is connected to bus 730 by audio controller 797, as illustrated. Other input devices, such as a pen and/or tabloid may be connected to bus 730 and an appropriate controller and software, as required, for use as input devices. DMA controller 760 is provided for performing direct memory access to RAM 710, which, as previously described, may be implemented in whole or part using chalcogenide-based nonvolatile memory devices in accordance with the principles of the present invention. A visual display is generated by video controller 765 which controls display 770. The display 770 may be of any size or technology appropriate for a given application.

In a cellular telephone or portable entertainment system embodiment, for example, the display 770 may include one or more relatively small (e.g. on the order of a few inches per side) LCD displays. In a large-scale data storage system, the display may implemented as large-scale multi-screen, liquid crystal displays (LCDs), or organic light emitting diodes (OLEDs), including quantum dot OLEDs, for example.

The system 700 may also include a communications adaptor 790 which allows the system to be interconnected to a local area network (LAN) or a wide area network (WAN), schematically illustrated by bus 791 and network 795. An input interface 799 operates in conjunction with an input device 793 to permit a user to send information, whether command and control, data, or other types of information, to the system 700. The input device and interface may be any of a number of common interface devices, such as a joystick, a touch-pad, a touch-screen, a speech-recognition device, or other known input device. In some embodiments of a system in accordance with the principles of the present invention, the adapter 790 may operate with transceiver 773 and antenna 775 to provide wireless communications, for example, in cellular telephone, RFID, and wifi computer implementations.

Operation of system 700 is generally controlled and coordinated by operating system software. The operating system controls allocation of system resources and performs tasks such as processing scheduling, memory management, networking, and I/O services, among things. In particular, an operating system resident in system memory and running on CPU 705 coordinates the operation of the other elements of the system 700.

In illustrative handheld electronic device embodiments of a system 700 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 755, keyboard 756 and mouse 757, for example. Embodiments with a transmitter, recording capability, etc., may also include a microphone input (not shown).

In an illustrative RFID transponder implementation of a system 700 in accordance with the principles of the present invention, the antenna 775 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 773 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 73 as an "answer-back" signal on the antenna 775 at a second carrier frequency $F_2$. In passive RFID systems power is derived from the interrogating signal and memory such as provided by a chalcogenide-based nonvolatile memory in accordance with the principles of the present invention is particularly well suited to such use.

We claim:

1. An apparatus, comprising:
   a phase-change memory cell;
   a first current source, said first current source comprising a first capacitor, said first capacitor discharging to provide a first current to said phase-change memory cell during a memory access; and
   a second current source, said second current source providing a second current to said phase-change memory during said memory access.

2. The apparatus of claim 1, wherein said first current is insufficient to accomplish said memory access.

3. The apparatus of claim 2, wherein the combination of said first current and said second current is sufficient to accomplish said memory access.

4. The apparatus of claim 1, wherein said first capacitor comprises a conductive line, said conductive line in electrical communication with said phase-change memory cell.

5. The apparatus of claim 1, wherein said first capacitor comprises a MOS capacitor.

6. The apparatus of claim 1, wherein said second current source comprises a second capacitor, said second capacitor discharging to provide said second current.

7. The apparatus of claim 6, wherein the capacitance of said first capacitor and the capacitance of said second capacitor are additive.

8. An apparatus, comprising:
   a phase-change memory cell;

a first current source, said first current source providing a first current to said phase-change memory cell during a memory access; said memory access being a set operation or a reset operation; and a second current source, said second current source providing a second current to said phase-change memory during said memory access.

9. The apparatus of claim 1, wherein said first current and said second current are provided simultaneously.

10. An apparatus, comprising:
a phase-change memory cell;
a first current source, said first current source providing a first current to said phase-change memory cell during a memory access;
a second current source, said second current source providing a second current to said phase-change memory during said memory access; and
a third current source, said third current source providing a third current to said phase-change memory cell during said memory access.

11. A method of operating a phase-change memory cell, comprising:
providing a phase-change memory cell;
initiating a memory access of said phase-change memory cell;
charging a first capacitor;
discharging said first capacitor to provide a first current during said memory access;
providing a second current during said memory access; and
terminating said memory access.

12. The apparatus of claim 11, wherein said first current is insufficient to accomplish said memory access.

13. The apparatus of claim 12, wherein the combination of said first current and said second current is sufficient to accomplish said memory access.

14. The method of claim 11, wherein said charging of said first capacitor occurs before said initiating said memory access.

15. The method of claim 11, wherein the time of said charging of said first capacitor is greater than the time of said memory access.

16. The method of claim 11, wherein said second current charges said first capacitor.

17. The method of claim 11, further comprising:
charging a second capacitor; and
discharging said second capacitor to provide said second current.

18. The apparatus of claim 8, wherein the current capacity of said first current source is insufficient to accomplish said memory access.

* * * * *